US006432794B1

(12) United States Patent
Lou

(10) Patent No.: US 6,432,794 B1
(45) Date of Patent: Aug. 13, 2002

(54) PROCESS FOR FABRICATING CAPACITOR

(75) Inventor: Chine-Gie Lou, Hsinchu (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/538,911

(22) Filed: Mar. 30, 2000

(30) Foreign Application Priority Data

Nov. 26, 1999 (TW) ........................................ 88120697 A

(51) Int. Cl.$^7$ ................................................ H01L 21/20
(52) U.S. Cl. ........................ 438/396; 438/253; 438/627; 257/303
(58) Field of Search ................... 438/238–251, 438/396–399, 643–680, 627, 253–256; 257/295–309, 768–769; 430/314–316; 427/81, 248–251

(56) References Cited

U.S. PATENT DOCUMENTS 6,010,744 A * 1/2000 Buskirk et al. ............... 427/81
6,294,425 B1 * 9/2001 Hideki ........................ 438/253
6,323,511 B1 * 11/2001 Marsh ........................ 257/295

* cited by examiner

*Primary Examiner*—Matthew Smith
*Assistant Examiner*—Calvin Lee
(74) *Attorney, Agent, or Firm*—Darby & Darby

(57) ABSTRACT

A process for fabricating a capacitor suitable for forming a bottom electrode layer of the capacitor on a substrate. First, a first dielectric layer is formed on a substrate. Then, a portion of the first dielectric layer is removed to form a contact hole. A conductive plug is formed within the contact hole. A seed layer is formed on the conductive plug. A sacrifice layer is formed on both the seed layer and the first dielectric layer. A predetermined region of the sacrifice layer is removed to form a recess so as to expose the seed layer. Then, a bottom electrode layer is formed by electroplating within the recess. The sacrifice layer is removed afterwards. Finally, a second dielectric layer and a top electrode layer are formed on the bottom electrode layer in sequence. The present invention is characterized in that it does not require a direct etching process on a platinum material to. form the bottom electrode layer. As a result, problems encountered during the platinum etching process such as the difficulty in controlling the critical dimension of an etched platinum bottom electrode layer can be overcome.

14 Claims, 9 Drawing Sheets

PROCESS FOR FABRICATING CAPACITOR

BACKGROUND OF THE INVENTION

1. Field of the Invention

The present invention relates to a process for fabricating a capacitor, and more particularly the invention relates to a process for fabricating a capacitor used in a memory cell of a DRAM.

2. Description of the Prior Art

The size of a capacitor in a memory cell is very important to a DRAM (dynamic random access memory), which directly influences the time interval required for the information renewal of the DRAM and which indirectly influences the reading speed on Information stored in the DRAM as well. Therefore, many efforts have been made to increase the capacitance value of a capacitor.

Capacitors can be classified structurally into two kinds: one is the trench capacitor and the other is the stacked capacitor. In order to increase the capacitance value of a trench capacitor, the depth of the trench capacitor should be enlarged, which will adversely result in too large a leakage current and a decreased reliability. Therefore, trench capacitors are not suitable for use when there is a need to increase the capacitance. Stacked capacitors on the other hand are more suitable or this purpose.

Enlarging coupling areas of the top and bottom electrodes of a capacitor is a way to increase the capacitance value. However, as the feature size of a semiconductor device is decreased, a more complicated process will typically be required for such a structural change, resulting in an escalation of production cost. Therefore, researchers have been increasingly focusing their attention on how to increase the capacitance value of a capacitor by carefully selecting different capacitor materials.

Conventionally, the top and bottom electrodes of a capacitor are made of polysilicon, and the dielectric layer situated between the electrodes is typically made of silicon oxide or silicon nitride. The dielectric constant of silicon oxide or silicon nitride is typically not high, or only seven at the most, and since the thickness of the dielectric layer can not be made too thin, the increase in the capacitance value is thus limited. Or the other hand, depletion region is easily formed in the top and bottom electrodes of a polysilicon capacitor, which causes the capacitance value to be decreased.

Since $(Ba,Sr)TiO_3$ (BST) has a dielectric constant as high as 500, using the BST material as the dielectric layer to increase the capacitance value of a capacitor has become a very popular topic recently. In addition, in order to solve the problem caused by depletion regions formed in the top and bottom polysilicon electrodes and leakage current resulted from the interface between the dielectric layer and the polysilicon, the material of choice for the top and bottom electrodes has been gradually replaced by a metal. Such capacitors having the top and bottom electrodes made of metal material are called metal-insulator-metal (MIM) capacitors. Furthermore, since platinum has the advantages of low leakage current and high thermal stability, it is very suitable for use as a metal electrode.

Generally, the bottom electrode of an MIM capacitor is fabricated by first forming a metal layer on a semiconductor substrate through a physical vapor deposition process or a chemical vapor deposition process, then the contour of the metal layer is further defined by means of a photo-etching process, in order to carve out a specific shape for the bottom electrode. Nonetheless, due to the unique physical characteristics of the platinum metal, it is very difficult to form a bottom electrode with platinum hat is capable of achieving an accurate critical dimension (CD) defined by a photo-eching process. Therefore, a need lo develop a new process for forming a platinum bottom electrode with accurate critical dimensions arises.

SUMMARY OF THE INVENTION

Accordingly, an object of the present invention is to solve the above-mentioned problems and to provide an improved process that can avoid the problems occurred during an etching process for platinum. as the difficulty in controlling the critical dimension needs to be counteracted.

To achieve the above object, the present invention provides a process for fabricating a capacitor. First, a first dielectric layer is formed on a substrate. Then, a portion of the first dielectric layer is removed to form a contact hole. A conductive plug is formed within the contact hole. A seed layer is formed on the conductive plug. A sacrifice layer is formed on both the seed layer and the first dielectric layer. A predetermined region of the sacrifice layer is removed to form a recess so as to expose he seed layer. Then, a bottom electrode layer is formed by electroplating within the recess. The sacrifice layer is removed afterwards. Finally, a second dielectric layer and a top electrode layer are formed on the bottom electrode Maker In sequence, thus a capacitor is fabricated.

The seed layer is preferably made of ruthenium (Ru). The bottom electrode layer and the top electrode layer are preferably made of platinum (Pt). And the second dielectric layer is preferably made of $(Ba,Sr.)TLO_3$ (BST)

The advantage presented by the present invention is that the etching step to form a pattern of the bottom electrode layer can be completely avoided, so the difficulty in platinum etching and the problem with controlling the respective critical dimensions can be a alleviated.

BRIEF DESCRIPTION OF THE DRAWINGS

The present invention will become more apparent and self-evident from the detailed description given hereinafter and the accompanying drawings, presented by way of illustration only and thus not intended to be limitative of the present invention.

DETAILED DESCRIPTION OF THE PREFERRED EMBODIMENTS

The present invention provides a process for fabricating capacitors, which is suitable for fabricating an MIM capacitor. Referring to FIG. 1 to FIG. 9, as cross-sectional views illustration the process flow of forming capacitor are shown according to a first preference embodiment of the present invention.

Figure 1:
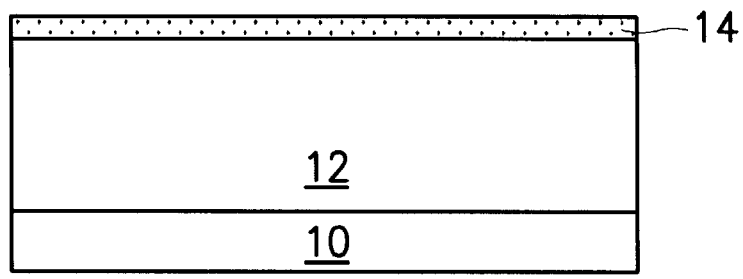
FIG. 1 to FIG. 9 are cross-sectional views illustrating the process flow of forming !he capacitor according to a first preferred embodiment of the present invention.

Referring to FIG. 1, a first dielectric layer 12 and a stop layer 14 are formed on a substrate 10 in sequence. Namely, the first dielectric layer 12 made of silicon oxide can be formed by low-pressure chemical vapor deposition (LPCVD), and the stop layer 14 mace of silicon nitride can be formed by LPCVD as well.

Figure 2:
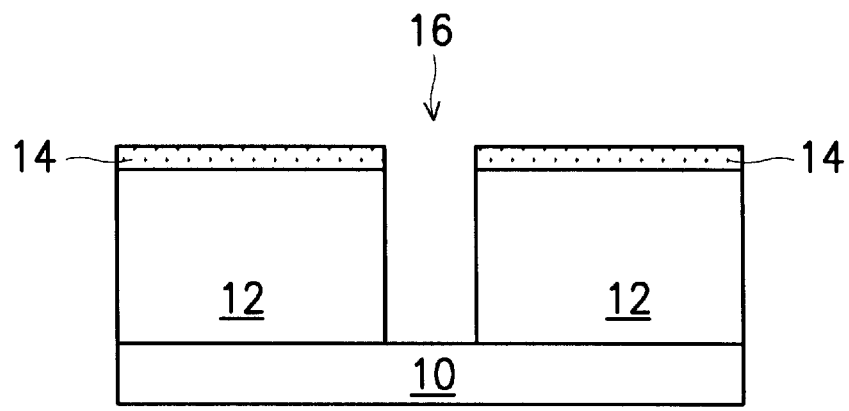

Then, a Portion of the stop layer 14 and a portion of the first dielectric layer 12 are removed to form a contact hole 16 as shown in FIG. 2. Namely, a resist layer (not shown) with a hole pattern can be formed on the stop layer 14 by photolithography so as to define the position of the contact hole 16. Then, the stop layer 14 and the first dielectric layer 12, which are not covered by the resist layer, are removed by anisotropic reactive ion etching (RIE). Finally, the resist layer is removed, and subsequently the contact hole 16 is formed as shown in FIG. 2.

Figure 3:
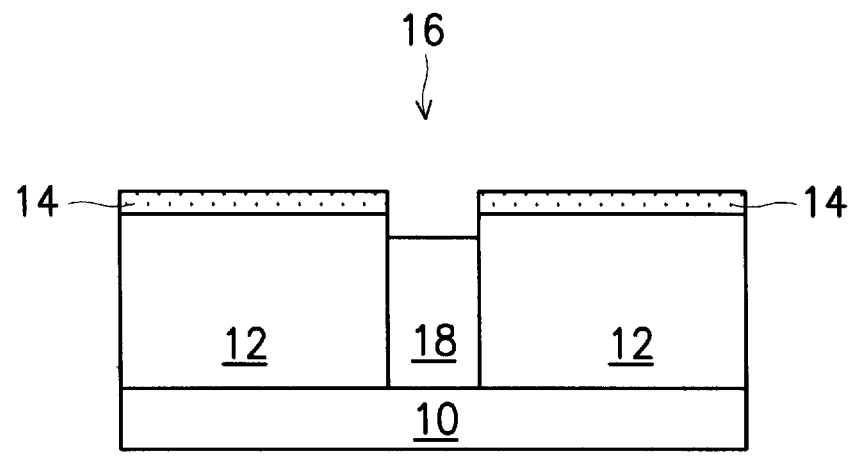

Furthermore, as shown in FIG. 3, a conductive plug 18 is formed within the perimeter of the contact hole 16. In this situation, a doped polysilicon layer (not shown) is formed on top of the stop layer 14 and inside the contact hole 16 by chemical vapor deposition so as to fill in the contact hole 16. Then, the portion of the doped polysilicon layer that covers the top of the stop layer 14 is removed by an over-etch-back process so as to form he conductive plug 18. In addition, the etching time of the over-etch-back process is controlled in order to form a conductive plug 18 having a surface lower than the surface of the stop layer 14 as shown in FIG. 3.

Figure 4:
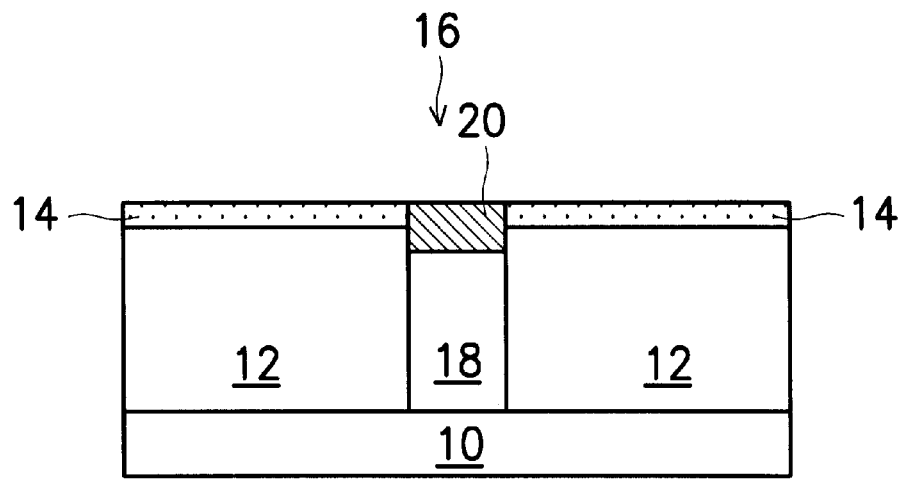

Referring to FIG. 4, a seed layer 20 is formed on the conductive plug 18. In this situation, a seed layer 20 made of ruthenium (Ru) is formed on the stop layer 14 and inside the contact hole 16 by physical vapor deposition. Then, the portion of the seed layer 20 that covers the top of the stop layer 14 is removed by an anisotropic etch-back process so as to retain the portion of the seed layer 20 located within the perimeter of the contact hole 16. As shown in FIG. 4, the surface of the seed layer 23 is essentially at the same height as the surface of the stop. layer 14.

Figure 5:
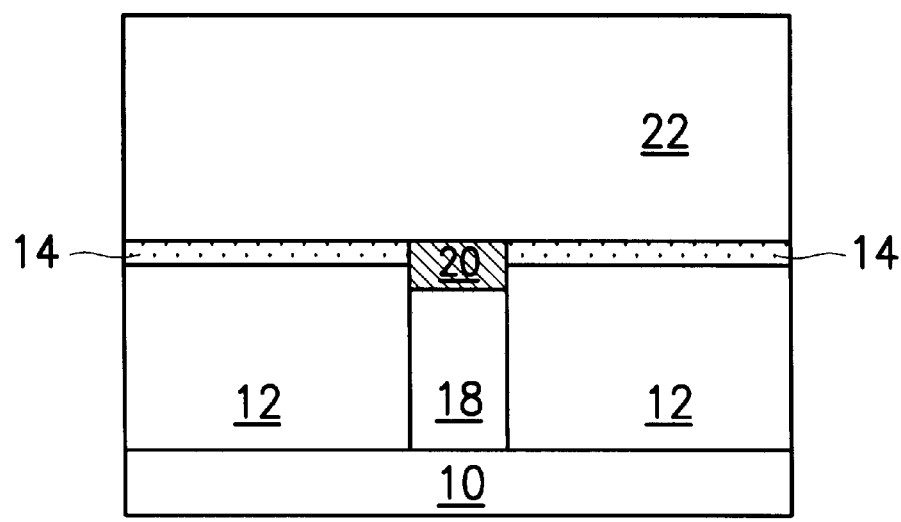

Referring to FIG. 5, a sacrifice layer 22 is formed across the tops of both the seed layer 20 and the stop layer 14. The sacrifice layer 22 made of silicon oxide can be formed by low-pressure chemical vapor deposition.

Figure 6:
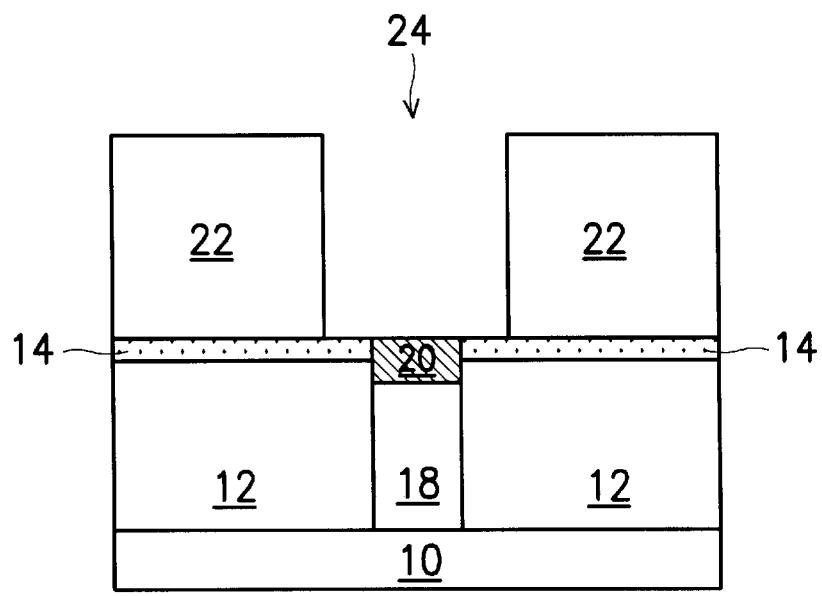

Refereeing to FIG. 6, a predetermined region of the sacrifice layer 22 is removed to form a recess 24 so as to expose the seed layer 20. Namely, a resist layer (not shown) with a recess pattern can be formed on the sacrifice layer 22 by photolithography so as to define the position of the recess 24. Then, the sacrifice layer 22 that is not covered by the resist layer is subsequently removed by anisotropic reactive ion etching (RIE) so as to expose the seed layer 20. Finally, the resist Layer is removed, and the recess 24 is thus formed as shown in FIG. 6.

Figure 7:
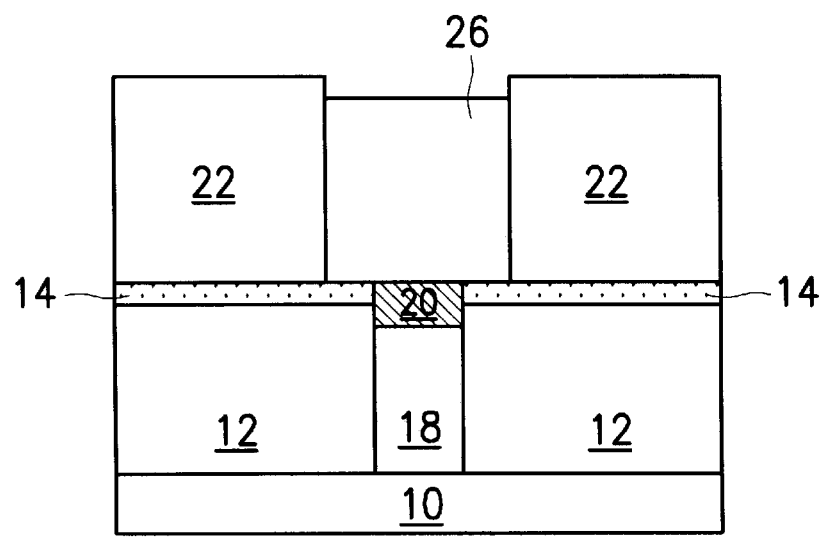

Referring to FIG. 7, a bottom electrode layer 26 is formed within the perimeter of the recess 24 by electroplating. In this case, a bottom electrode layer 26 made of platinum can be formed within the perimeter of the recess 24 by using the ruthenium seed layer 20 as a seed layer of electroplating process. The electroplating time should be optimally controlled in order to fill in the electroplated bottom electrode layer 26 inside the recess 24 as much as possible but not exceeding the level of the surface of the sacrifice layer 22; i.e., the surface of the bottom electrode layer 26 should not be higher than the surface of the sacrifice layer 22 as shown in FIG. 7.

Figure 8:
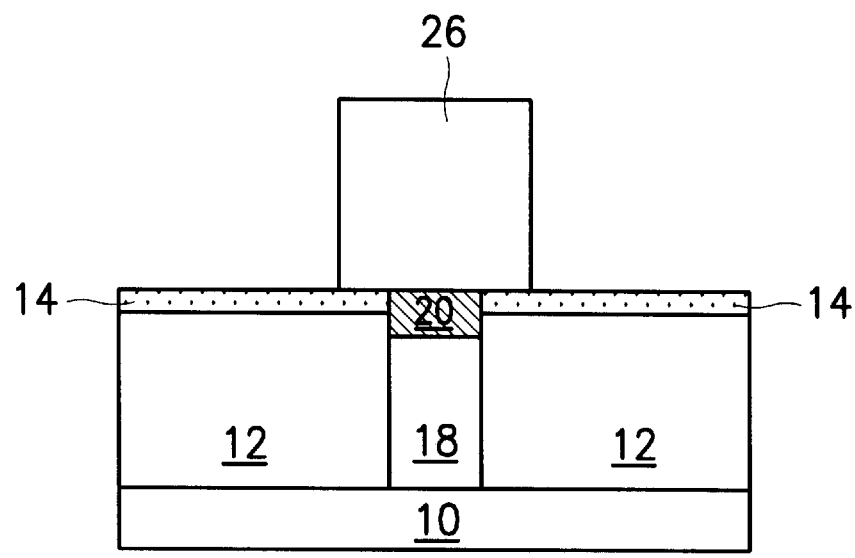

Referring to FIG. 8, the next step is to remove the sacrifice layer 22 covering the top of the stop layer 14. In this situation, a wet etching process is performed using a diluted HF (DHF) solution as the etching solution. Since DHF does not erode platinum and silicon nitride, it can remove the sacrifice layer 22 made of silicon oxide all the way until the etching solution is stopped by he stop layer 14 made of silicon nitride as shown in FIG. 8.

Figure 9:
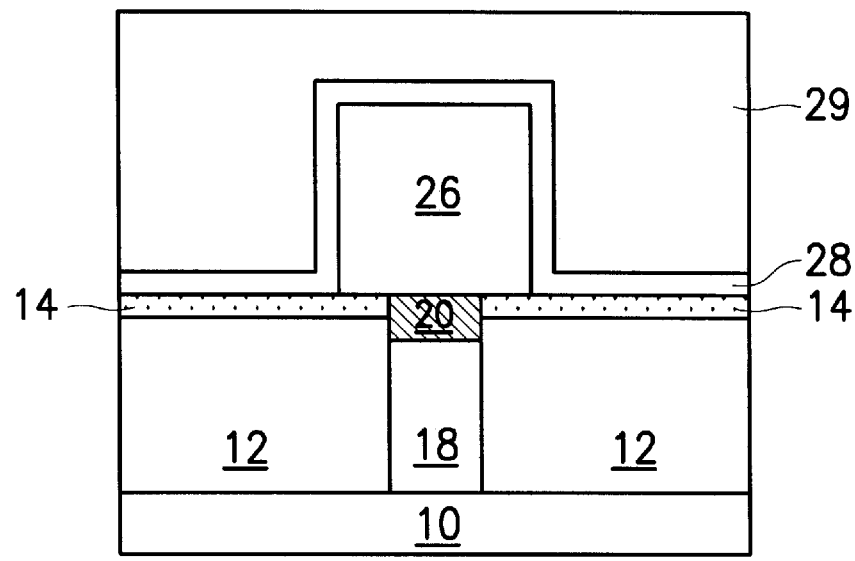

Finally, referring to FIG. 9, a second dielectric layer 28 and a top electrode layer 29 are formed in sequence on top of the bottom electrode layer 26. Namely, the second dielec-tric layer 28 can be made of (Ba,Sr.) TiO$_3$ (BST) and formed by chemical vapor deposition, and the top electrode layer 29 can be made of platinum and formed by physical vapor deposition. Thus far, an MIM capacitor is completed.

Refer to FIG. 10 to FIG. 19, which collectively show cross-sectional views illustrating the process flow of forming a capacitor according to a second preferred embodiment of the present invention.

Figure 10:
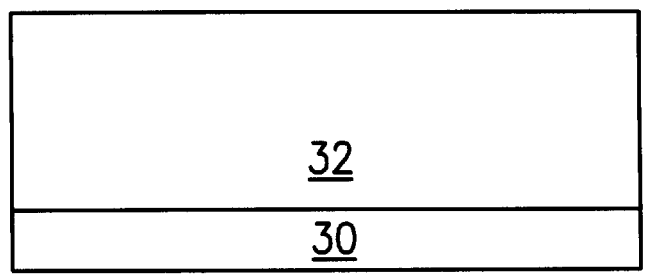
FIG. 10 to FIG. 19 are cross-sectional views illustrating the process flow of forming the capacitor according to a second preferred embodiment of the present invention.

Referring to FIG. 10, a first dielectric layer 32 is formed on a substrate 30. Namely, the first dielectric layer 32 made of silicon oxide is formed by low-pressure chemical vapor deposition.

Figure 11:
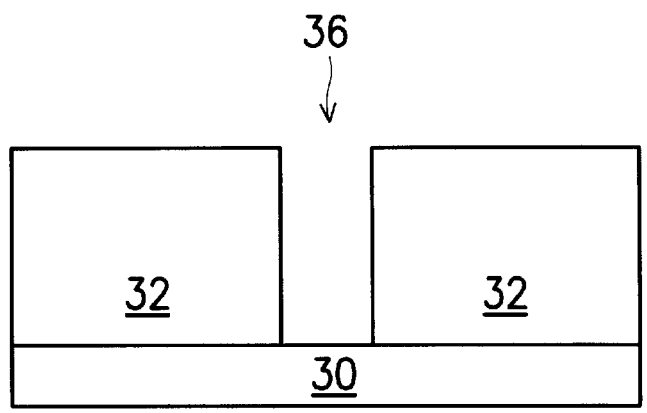

Then, a portion of the first dielectric layer 32 is removed to form a contact hole 36 as shown in FIG 11. In this situation, a resist layer (not shown) with a hole pattern is formed on the first dielectric layer 32 by photolithography so as to define the poster on of the contact hole 36. Further, the first dielectric layer 32 that is not covered by the resist layer is removed by anisotropic reactive ion etching. Finally, the resist layer is removed, and the contact hole 36 is thus formed as shown in FIG. 11.

Figure 12:
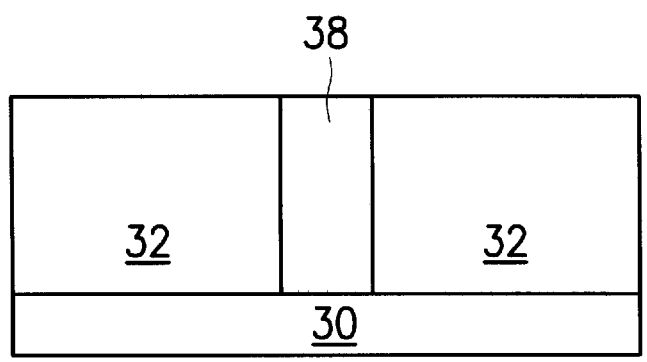

Referring to FIG. 12, in this step a conductive plug 38 is formed inside the contact hole 36. Namely, a doped polysilicon layer (not shown) is formed on the first dielectric layer 32 and within the perimeter of the contact hole 36 by chemical vapor deposition so as to fill in the contact hole 36. Then, the portion of the doped polysilicon layer that covers the top of the first dielectric layer 32 is removed by an etch-back process so as to form the conductive plug 38. In addition, the etching time of the etch-back process should be optimally controlled so that the conductive plug 38 can have a top surface level with the surface of the first dielectric layer 32 as shown in FIG. 12.

Figure 13:
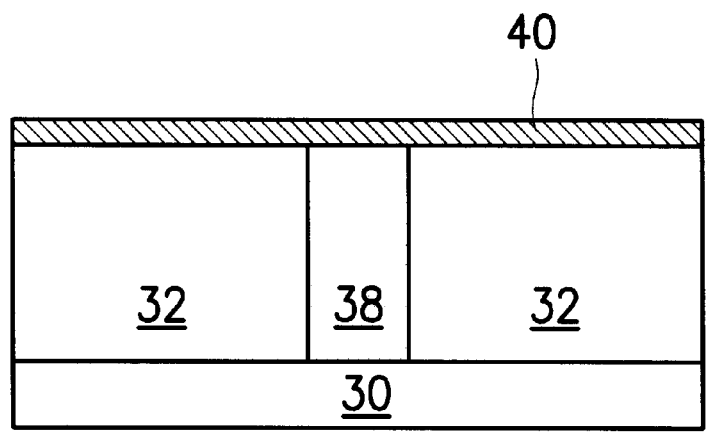

Referring to FIG. 13, a seed layer 40 is formed across the tops of both the conductive plug 38 and the first dielectric layer 32. Namely, a seed layer 40 made of ruthenium (Ru) is formed on the tops of the conductive plug 38 and the first dielectric layer 32.

Figure 14:
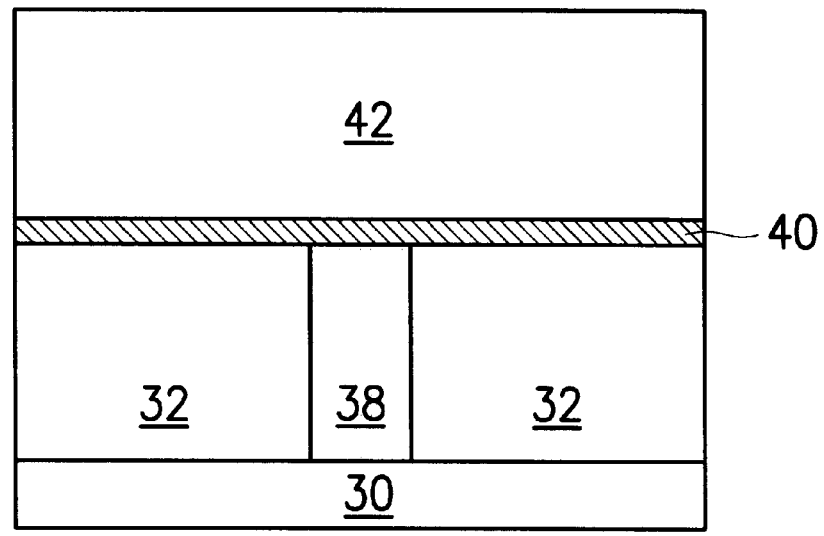

Referring to FIG. 14, a sacrifice layer 42 is additionally formed on top of the seed layer 40. Namely, the sacrifice layer 42 can be mace of silicon oxide and formed by low-pressure chemical vapor deposition.

Figure 15:
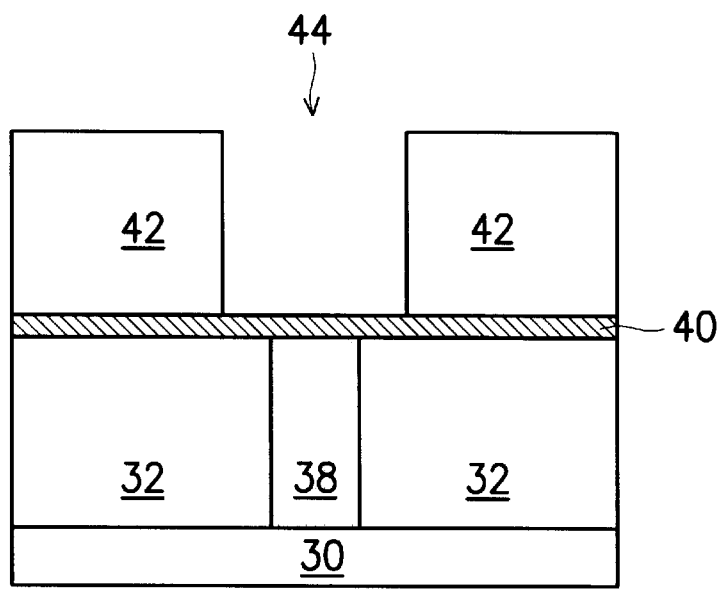

Referring Lo FIG. 15, a predetermined region of the sacrifice layer 42 is removed to form a recess 44 so as to expose the seed layer 40. In this situation, a resist layer (not shown) with a recess pattern is formed on top of the sacrifice layer 42 by photolithography so as to define the position of the recess 44. Then, the sacrifice layer 42 that is not covered by the resist layer is removed by anisotropic reactive ion etching (RIE) so as to expose the seed layer 40. Finally, the resist layer is removed, and the recess 44 is thus formed as shown in FIG. 15.

Figure 16:
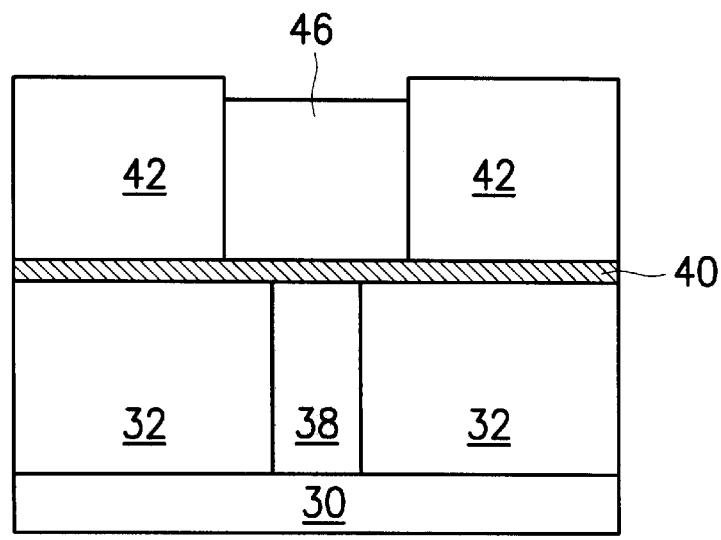

Referring to FIG. 16, a bottom electrode layer 46 is formed inside the recess 44 by electroplating. Namely, a bottom electrode layer 46 made of platinum is formed within the perimeter of the recess 44 by using the ruthenium seed layer 40 as a seed layer of electroplating process. The electroplating time should be optimally controlled in order to fill in the electroplated bottom electrode layer 46 inside the recess 44 as much as possible but not exceeding the level of the surface of the sacrifice layer 42; i.e., the surface of the bottom electrode layer 46 should not be higher than the surface of the sacrifice layer 42, as shown in FIG. 16.

Figure 17:
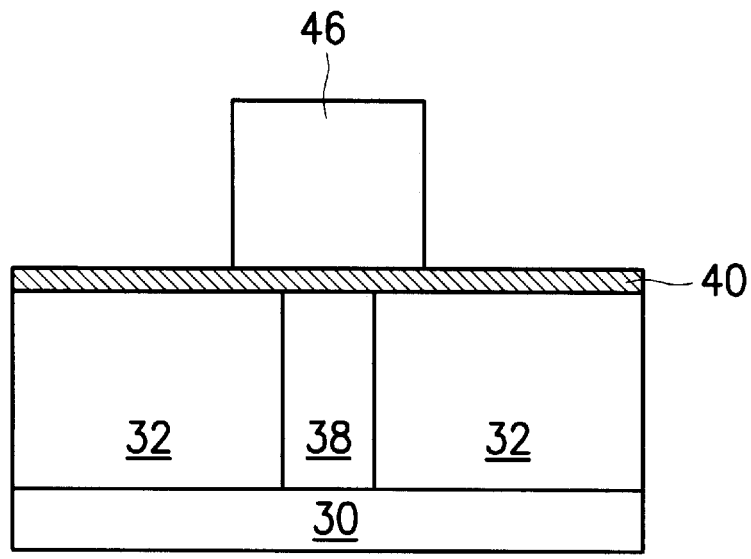

Referring to FIG. 17, the next step is to remove the sacrifice Layer 42 or the seed layer 40. Namely, the wet etching process is performed using a diluted HF (DHF)

solution as the etching solution. Since DHF does not erode platinum and ruthenium, it can remove the sacrifice layer 42 made of silicon oxide all the way until the etching solution is stopped by the seed layer 40 made of ruthenium as shown in FIG. 17.

Figure 18:
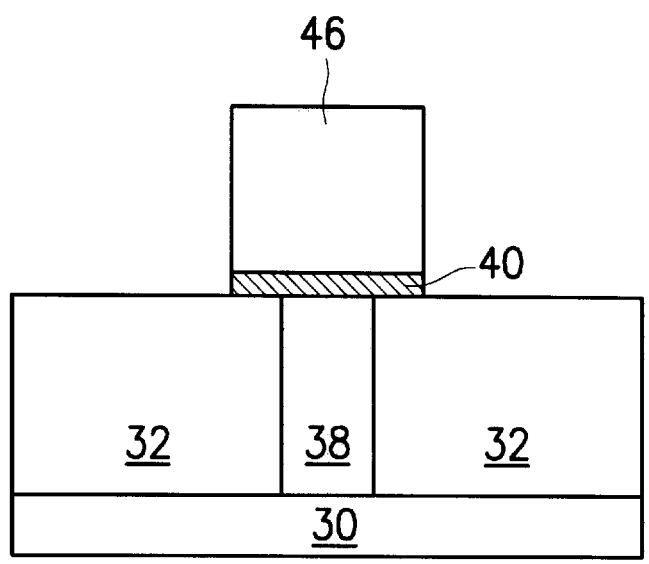

Referring to FIG. 18, the portion of the seed layer 40 not covered by the bottom electrode layer 46 is removed. In this situation, an anisotropic RTE process is performed by using the bottom electrode layer 46 as a hard mask so that the portion of the seed layer 40 not covered by the bottom electrode layer 46 is removed by etching, reaching only as far as the surface of the first dielectric layer 32 as shown in FIG. 18.

Figure 19:
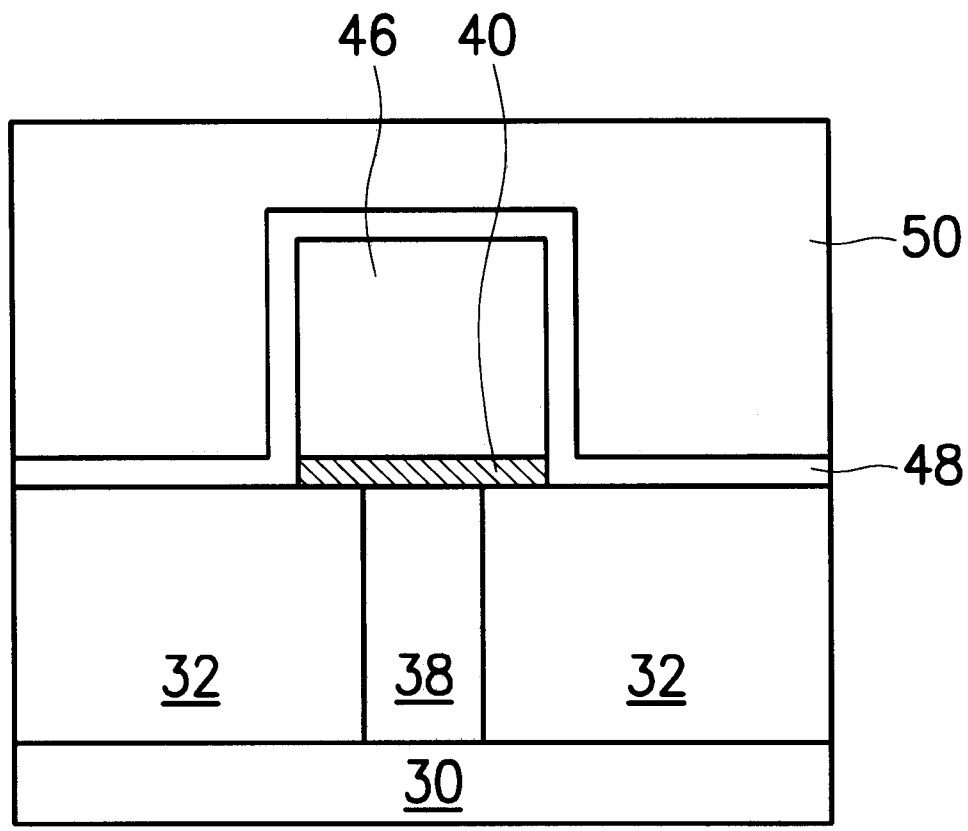

Finally, referring to FIG. 19, a second dielectric layer 48 and a top electrode layer 50 are formed in sequence on top of the bottom electrode layer 46. Namely, the second dielectric layer 48 can be made of $(Ba,Sr)TiO_3$ (BST) and formed by chemical vapor deposition, and She top electrode layer 50 can be made of platinum and formed by physical vapor deposition. Thus far, an MIM capacitor is completed.

The important significance resides in both of the first and second embodiment o: the present invention is that the aforementioned bottom electrode layers 26 and 46 are each formed by an electroplating process. Since platinum is selectively electroplated onto a substrate with a predetermined recess pattern, a self-aligned bottom electrode layer an therefore be formed. Further, the present invention does not require any additional etching step to define the position of the bottom electrode layer. Hence, the difficulties involved in etching platinum directly, as an accurate critical dimension needs to be in control during the etching process, can be avoided.

Accordingly, the present invention uses a method of selective electroplating to form the platinum bottom electrode layer, which proves to be a much more simpler process comparing with the convent on a process that forms the bottom electrode layer by physical vapor deposition method. Also, the electroplating process of the present invention does not require a high vacuum environment so the overall production cost is reduced.

The foregoing description of the preferred embodiments of the present invention has been provided for the purpose of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. A process for fabricating a capacitor, comprising the following steps:

forming a first dielectric layer on a substrate;

forming a stop layer on the first dielectric layer;

removing a portion of the first dielectric layer and a portion of the stop layer to form a contact hole;

forming a conductive plug within the contact hole;

forming a seed layer on the conductive plug;

forming a sacrifice layer on both the seed layer and the stop layer;

removing a predetermined region of the sacrifice layer using the stop layer to serve as an etch stop layer to form a recess so as to expose the seed layer;

forming a bottom electrode layer by electroplating within the recess;

removing the sacrifice layer; and forming a second dielectric layer and a top electrode layer on the bottom electrode layer in sequence.

2. The process as claimed in claim 1, wherein the conductive plug has a surface lower than the surface of the stop layer.

3. The process as claimed in claim 2, wherein the step of forming the seed layer on the conductive plug comprises the following steps:

forming he seed layer on the stop layer and within the contact hole; and removing the portion of the seed layer that covers the stop layer by arisotropic etching so as to retain the portion of the seed layer Located within the contact hole.

4. The process as claimed in claim 1, wherein the step of removing a predetermined region of the sacrifice layer is performed by arisotropic etching.

5. The process as claimed in claim 1, wherein the step of removing the sacrifice layer is performed by wet etching.

6. The process as claimed in claim 1, wherein the substrate is made of silicon.

7. The process as claimed in claim 1, wherein the first dielectric layer is made of silicon oxide.

8. The process as claimed in claim 1, wherein the conductive plug is made of doped polysilicon.

9. The process as claimed in claim 1, wherein the seed layer is made of ruthenium.

10. The process as claimed in claim 1, wherein the bottom electrode layer is made of platinum.

11. The process as claimed in claim 1, wherein the second dielectric layer is made of $(Ba,Sr)TiO_3$ (BST).

12. The process as claimed in claim 1, wherein the top electrode layer is made of platinum.

13. The process as claimed in claim 1, wherein the step of forming the seed layer is performed on the conductive plug as well as on the first dielectric layer.

14. The process as claimed in claim 13, further comprising a step of removing the portion of the seed layer not covered by the bottom electrode layer.

* * * * *